United States Patent
Tiberghien et al.

(10) Patent No.: US 10,288,198 B2
(45) Date of Patent: May 14, 2019

(54) CONNECTING PLUG, COOLING CIRCUIT EQUIPPED WITH SUCH A CONNECTING PLUG AND METHOD FOR CONNECTING SUCH A COOLING CIRCUIT AND A COLD PLATE

(71) Applicant: STAUBLI FAVERGES, Faverges (FR)

(72) Inventors: Alain-Christophe Tiberghien, Sevrier (FR); Christophe Durieux, Gilly sur Isere (FR); Frederic Morel, Lathuile (FR)

(73) Assignee: STAUBLI FAVERGES, Faverges (FR)

( * ) Notice: Subject to any disclaimer, the term of this patent is extended or adjusted under 35 U.S.C. 154(b) by 640 days.

(21) Appl. No.: 14/794,001

(22) Filed: Jul. 8, 2015

(65) Prior Publication Data
US 2016/0010772 A1    Jan. 14, 2016

Related U.S. Application Data

(60) Provisional application No. 62/021,980, filed on Jul. 8, 2014.

(51) Int. Cl.
*F16L 21/02* (2006.01)
*B23P 15/26* (2006.01)
(Continued)

(52) U.S. Cl.
CPC .............. *F16L 21/02* (2013.01); *B23P 15/26* (2013.01); *F16L 25/0018* (2013.01);
(Continued)

(58) Field of Classification Search
CPC ........ F28F 3/12; F28F 9/0258; F28F 2280/08; F16L 27/026; F16L 55/1108; F16L 37/26;
(Continued)

(56) References Cited

U.S. PATENT DOCUMENTS

| | | | | |
|---|---|---|---|---|
| 3,508,580 A | * | 4/1970 | Snyder, Jr. | F16L 37/23 137/614.04 |
| 8,894,431 B2 | * | 11/2014 | Tiberghien | F16L 37/56 439/247 |

(Continued)

FOREIGN PATENT DOCUMENTS

| CN | 103225722 A | 7/2013 |
|---|---|---|
| CN | 103427231 A | 12/2013 |

*Primary Examiner* — Jon T. Schermerhorn, Jr.

(57) ABSTRACT

This connection plug (14A, 14B; 14) includes a connecting plate (18) equipped with at least a passage channel (46) centered on a central axis (X46), at least one fluid coupling element (20A, 20B) able to be fluidly coupled with an external fluid coupling element of a cold plate. The fluid coupling element is movable (M1), in a housing of the connecting plate, with respect to the passage channel of the connecting plate for misalignment compensation of the fluid coupling element while being in fluid communication with the passage channel. This connection plug also includes a support member (22) able to be fixed with respect to an internal channel (16) for a fluid communication between the internal channel and the passage channel. The connecting plate (18) is movable (M2) with respect to the support member (22) along a principal axis (T) transverse to the central axis (X46) of the passage channel (46). This connection plug (14A, 14B; 14) also includes a spring (34) designed to elastically push the connecting plate with respect to the support member along the principal transverse axis towards a position in abutment against an internal surface of the support member.

18 Claims, 10 Drawing Sheets

(51) Int. Cl.
    *F28F 3/12*     (2006.01)
    *F16L 25/00*     (2006.01)
    *F16L 35/00*     (2006.01)
    *F16L 37/50*     (2006.01)
    *F16L 37/56*     (2006.01)
    *F16L 39/04*     (2006.01)
    *F16L 37/34*     (2006.01)
    *F28F 9/02*     (2006.01)
    *H05K 7/20*     (2006.01)
    *E02F 9/22*     (2006.01)

(52) U.S. Cl.
CPC ............... *F16L 35/00* (2013.01); *F16L 37/34* (2013.01); *F16L 37/50* (2013.01); *F16L 37/56* (2013.01); *F16L 39/04* (2013.01); *F28F 3/12* (2013.01); *F28F 9/0258* (2013.01); *H05K 7/20272* (2013.01); *E02F 9/2275* (2013.01); *F28F 2280/08* (2013.01)

(58) Field of Classification Search
CPC . F16L 37/22; F16L 37/23; F16L 37/53; F16L 37/60; F16L 27/053; F16L 27/08; F16L 27/0804; F16L 27/0816; F16L 27/082; H05K 7/20272
See application file for complete search history.

(56) References Cited

U.S. PATENT DOCUMENTS

2013/0192797 A1     8/2013   Tiberghien et al.
2016/0270260 A1*   9/2016   Franz ................. H05K 7/20272

* cited by examiner

US 10,288,198 B2

CONNECTING PLUG, COOLING CIRCUIT EQUIPPED WITH SUCH A CONNECTING PLUG AND METHOD FOR CONNECTING SUCH A COOLING CIRCUIT AND A COLD PLATE

TECHNICAL FIELD OF THE INVENTION

The present invention relates to a connecting plug. The invention also relates to a cooling circuit equipped with such a connecting plug. Finally, the invention relates to a method for connecting such a cooling circuit and a cold plate.

BACKGROUND ART OF THE INVENTION

In the technical field of cooling circuits, in particular cooling circuits designed for a cold plate, it is known to couple a cold plate with a cooling circuit, so that a fluid communication can be established between them, along a fluid direction, and the cooling fluid cools some electronic components mounted on the cold plate. The cold plate is provided with a circulation channel and two external coupling elements, whereas the cooling circuit is equipped with a manifold supplying the cooling fluid and with a connection plug, on which two coupling elements are mounted. The coupling elements of the cooling circuit and the external coupling elements of the cold plate are designed to come in a coupled configuration and should ensure a fluidic communication.

However, the coupling elements of the cooling circuit and of the cold plate might be in some shifted positions, as they are not in the coupled configuration, so that the fluid communication might be problematic.

Moreover, during the fluid communication, it is known to move the cold plate in a direction which is transversal with respect to the fluid direction, in order to achieve a locked or connected configuration of the cold plate.

Thus, it is known to provide coupling elements which are capable of a tight movement with respect to a corresponding fluid channel with which each coupling element is in fluid communication. This tight movement allows compensating a misalignment of the coupling elements. However, such a tight movement of the coupling elements must take in consideration the maximal amplitude of the misalignment and the transversal movement towards the locked configuration of the cold plate. Therefore, the external coupling elements of the cooling circuit are provided with large input chamfers which make the coupling elements bulky.

Moreover, it is known to urge, for an example by an elastic device, each coupling element towards a middle position before the compensation of the misalignment during the coupling. Such an urging effort might alter the coupling elements during coupling. It is then necessary to add some guiding posts for the cold plate, in order to align the external coupling elements of the cold plate and the coupling elements of the cooling circuit before coupling. Therefore, this approach also leads to a bulky solution, which is not suitable for some uses.

SUMMARY OF THE INVENTION

One object of this invention is to remedy this drawback more particularly by proposing a novel connection plug for a cooling circuit which is compact and allows a precise alignment between the coupling elements of the cooling circuit and the coupling elements of the cold plate for the fluid coupling as well as a transversal movement of the connecting plate.

To this end, the invention concerns a connection plug, this connection plug including a connecting plate equipped with at least a passage channel centered on a central axis, at least one fluid coupling element able to be fluidly coupled with an external fluid coupling element of a cold plate. The fluid coupling element is movable, in a housing of the connecting plate, with respect to the passage channel of the connecting plate for misalignment compensation of the fluid coupling element while being in fluid communication with the passage channel. According to the invention, the connection plug includes a support member able to be fixed with respect to an internal channel for a fluid communication between the internal channel and the passage channel. The connecting plate is movable with respect to the support member along a principal axis transverse to the central axis of the passage channel and the connection plug also includes a spring designed to elastically push the connecting plate with respect to the support member along the principal transverse axis, towards a position in abutment against an internal surface of the support member.

Owing to the invention, the misalignment compensation of the fluid coupling elements and the transversal movement of the connecting plate are independent one from each other. Thus, the volume of the connection plug is reduced, as well as the stress forces to which it is subjected. The fluid coupling element is movable with respect to the connecting plate and, the connecting plate is movable with respect to the support member. Moreover, the second movement allows reaching a locked configuration of the connection plug of the cooling circuit. Further, the elastic forces of the spring are not transmitted to the fluid element couplings when each fluid coupling element moves within the connecting plate, which reduces noticeably the connection forces needed in order to establish the fluid communication.

According to further aspects of the invention which are advantageous but not compulsory, such a connection plug might incorporate one or several of the following features taken in any admissible configuration:

- The fluid coupling element includes a base, able to move in a plane perpendicular to the central axis relative to the connecting plate, and a tip, designed to cooperate with an external coupling element of the cold plate.
- The base of the fluid coupling element is housed in the housing of the connecting plate and the housing of the connecting plate and the base of the fluid coupling element are cylindrical.
- The support member defines a housing designed to house the connecting plate and the base is sandwiched between the support member and the connecting plate.
- A circular seal is located in the connecting plate around the passage channel, the circular seal defines a central axis and the central axis of the circular seal is shifted with respect to the central axis of the passage channel.
- The support member has two lateral surfaces able to cooperate with two lateral surfaces of the connecting plate for guiding the movement of the connecting plate along the principal transverse axis.
- A cap is mounted on a lateral opening of the support member, the spring being in contact with the cap at a first end and in contact with the connecting plate at a second end, the first end of the spring being located outside the support member.
- The connecting plate is equipped with two passage channels, the connection plug includes two fluid coupling elements, each one designed to be in fluid communication with the corresponding passage channel, each fluid coupling elements is able to move with respect to the corresponding passage channel, and the connecting plate is movable along the principal transverse axis.

The connection plug comprises at least one fastening screw designed to fix the support member to a manifold and in that a head of the fastening screw is embedded with respect to an outer surface of the connection plug.

Each fastening screw is received in an oblong hole of the connecting plate.

The invention also concerns a cooling circuit for a cold plate including a manifold equipped with the at least one internal channel, at least one connection plug as mentioned here-above and each support member being fixed to the manifold.

One can also provide that the connecting plate is sandwiched between the support member and the manifold.

Furthermore, when the connecting plate is shifted along principal axis against the spring with a maximal amplitude, the passage channel of the connecting plate entirely overlaps the corresponding internal channel of the manifold.

Moreover, the invention concerns an assembly of a cooling circuit as mentioned here-above and a cold plate provided with a cooling channel and two external coupling elements. According to the invention, this assembly is designed to be in a coupled configuration, where the two external coupling elements of the cold plate are in fluid communication with the two fluid coupling elements of the cooling circuit, and, when the assembly is in the coupled configuration, the cold plate is able to move along the principal traverse axis.

Finally, the invention concerns a method for connecting a cooling circuit as mentioned here-above and a cold plate provided with a cooling channel and two external coupling elements, the method comprising at least the successive steps of:
a) aligning the fluid coupling elements with respect to the external coupling elements by moving the fluid coupling elements relative to the corresponding passage channel of the connecting plate,
b) fluidly coupling the fluid coupling elements with the external coupling elements,
c) moving the cold plate relative to the support member along the principal transverse axis.

One can also provide that, during step c), the cold plate moves relative to at least one of the connecting plate of the cooling circuit along the principal transverse axis.

BRIEF DESCRIPTION OF THE DRAWINGS

The present invention and its advantages will be well understood on the basis of the following description, which is given as an illustrative example, without restricting the scope of the invention and in relation with the annexed drawings. In the drawings.

DETAILED DESCRIPTION OF THE INVENTION

Figure 1:
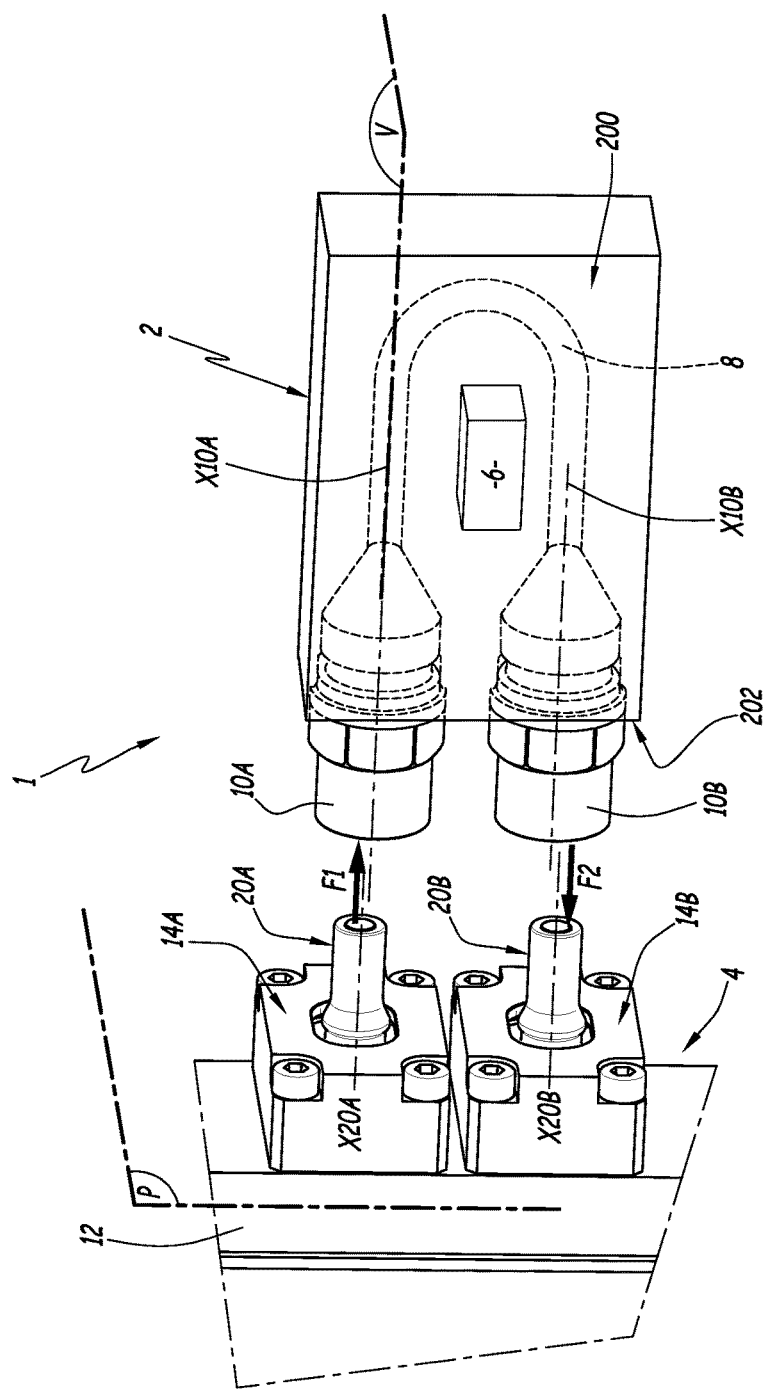
FIG. 1 is a perspective view of an assembly of a cooling circuit and a cold plate according to a first embodiment of the invention.

FIG. 1 shows a fluid assembly 1. Assembly 1 includes a cold plate 2 and a cooling circuit 4. Assembly 1 is designed to ensure a fluidic coupling between cold plate 2 and cooling circuit 4.

Cold plate 2 bears some electronic components 6 and is equipped with a cooling channel 8, a first external coupling element 10A and a second external coupling element 10B. Electronic components 6 are placed on a lateral face 200 of cold plate 2. Cooling channel 8 of cold plate 2 has a circular cross section and is U shaped. Cooling channel 8 is connected to external coupling elements 10A and 10B which are located and opened on an end face 202 of cold plate 2. Each external coupling element 10A and 10B defines a central axis X10A and X10B. Axes X10A and X20A are fixed with respect to cold plate 2. Central axes X10A and X10B are parallel. Each external coupling element 10A and 10B includes an internal chamfer 11, which converges towards channel 8, and a shut-off valve 13. External coupling elements 10A and 10B and cooling channel 8 of the cold plate 2 are designed to allow the circulation of a cooling fluid in cold plate 2 and to cool down electronic components 6. The cooling fluid enters cooling channel 8 through external coupling element 10A and exits this channel from external coupling element 10B. Therefore, the cooling fluid defines a first fluid direction F1 across external coupling element 10A, parallel to axis X10A and directed towards the cooling channel 8. The cooling fluid also defines a second fluid direction F2 across external coupling element 10B, parallel to axis X10B and directed from cooling channel 8 towards the outside of the cold plate 2.

Cooling circuit 4 is designed to supply the cooling fluid to the cold plate 2. Cooling circuit 4 includes a manifold 12, a first connection plug 14A and a second connection plug 14B.

Manifold 12 is designed to distribute and collect the cooling fluid to and from cooling channel 8. Manifold 12 is equipped with an internal channel 16 for each one of the connection plugs 14A and 14B.

Figure 2:
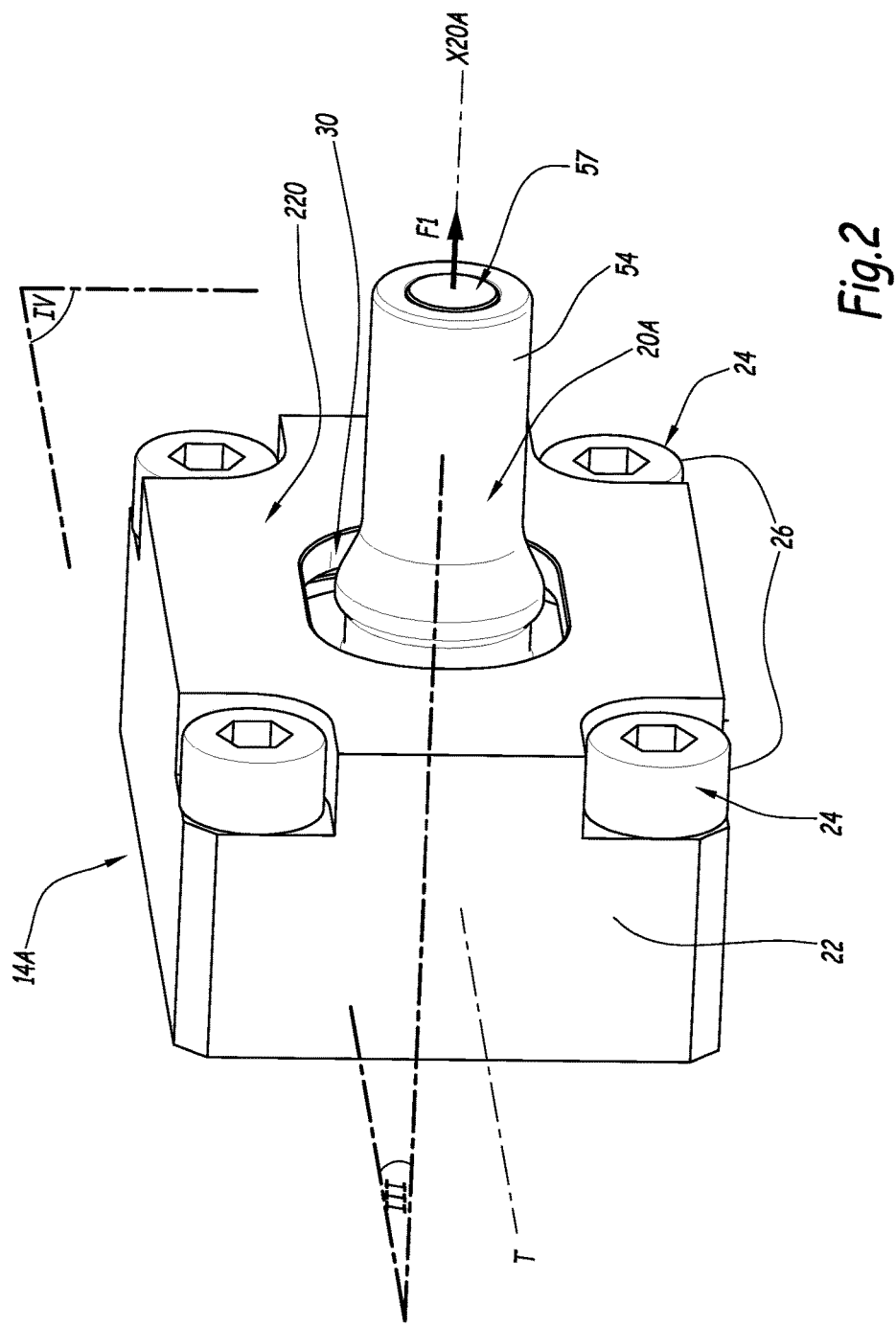
FIG. 2 is a perspective view of a connection plug of the cooling circuit of FIG. 1.

FIG. 2 shows connection plug 14A of cooling circuit 4. Here-under a detailed description of connection plug 14A is given. Since connection plugs 14A and 14B are identical, this description can be transposed to connection plug 14B.

Connection plug 14A is designed to couple with external coupling element 10A and, then, to define a fluid communication between therm. Therefore, fluid direction F1 defined for external coupling element 10A is also defined for connection plug 14A.

Connection plug 14A includes a connecting plate 18, a fluid coupling element 20A which extends along a central axis X20A, a support member 22, some fixing means 24 and a shifting device 25.

Connection plug 14A lays on a plane P which is defined by manifold 12 perpendicular to axis X20A and, therefore, to fluid direction F1 when axes X10A and X20A are parallel. On this plane P some transversal directions are defined, which are perpendicular to fluid direction F1. Amongst these transversal directions, a principal direction F3 is defined, which extends along a principal transverse axis T.

Fixing means 24 comprise four fastening screws. A head 26 of each fastening screw 24 is embedded with respect to a front outer face 220 of support member 22 of the connection plug 14A. Fixing means 24 are designed to immobilize the support member 22 of the connection plug 14A onto manifold 12, with respect to the internal channel 16 of the manifold 12. Thus, fixing means 24 are rigidly connected to support member 22 along transversal directions which are perpendicular to fluid direction F1.

Support member 22 is rigidly connected, by fastening screws 24, to manifold 12 and it is therefore fixed with respect to the internal channel 16. Support member 22 defines a protection housing 28 designed to accommodate connecting plate 18. Housing 28 of support member 22 is opened in a direction opposite to fluid direction F1 and, therefore, towards manifold 12. 29 denotes the base or back opening of housing 28 oriented towards manifold 12. The mouth of channel 16 of the manifold 12 is placed within opening 29.

Support member 22 also includes a front opening 30, provided on front outer surface 220, and a lateral opening 32 extending through support member 22 along principal transverse axis T, provided on a lateral outer surface 222 of support member 22. Fluidic coupling element 20A goes through front opening 30. Shifting device 25 goes through lateral opening 32.

Shifting device 25 includes an elastic spring 34 which is designed to push connecting plate 18 towards a position in abutment against an internal surface 224 of support member 22, along principal transverse axis T, in a non-shifted position. The spring 34 is a coil compression spring that extends along the principal transverse axis T. The spring 34 only acts along principal transverse axis T. Moreover, shifting device 25 includes a cap 36 which is inserted in lateral opening 32. At a first end 342, spring 34 of shifting device 25 is in abutment against cap 36 and, at the other end 344, it is in abutment against connecting plate 18, so that shifting device 25 is designed to elastically push connecting plate 18 with respect to support member 22 along principal transverse axis T, in a principal direction F3 oriented from lateral opening 32 towards internal surface 224. Thanks to cap 36, the contact between first end 342 of spring 34 and cap 36 is placed outside support member 22, so that the length of spring 34 is longer than the length of a spring totally included in housing 28. As a consequence, less variations of elastic forces occur when spring 34 is compressed.

Connecting plate 18 is designed to accommodate fluid coupling element 20A. To this end, connecting plate 18 defines a housing 38 which is opened towards front opening 30, thus in fluid direction F1 when axes X10A and X20A are parallel. Connecting plate 18 includes a flat base 40, a first portion 42, a second portion 44 and a passage channel 46.

A circular seal 50 is located around passage channel 46 and housed in a groove provided on a surface 182 of connecting plate 18. Then, connecting plate 18 slides on manifold 12, along plane P. Passage channel 46 of connecting plate 18 is located in base 40 and is designed to make a fluid communication between fluid coupling element 20A housed in housing 38 and channel 16 of manifold 12. Passage channel 46 is centered on a central axis X46, is circular and has a diameter d46. Passage channel 46 includes a chamfer 48 opening towards manifold 12.

Circular seal 50 has a diameter d50 and is centered on a central axis X50. Central axis X50 of circular seal 50 is shifted, with respect to central axis X46 of passage channel 46, along principal axis T, by a non zero distance d. Circular seal 50 is located around chamfer 48 and is in contact with manifold 12 around internal channel 16. Thus, seal 50 is designed to provide tightness between connecting plate 18 and manifold 12 and ensure a leaktight fluid communication between passage channel 46 and channel 16. Channel 16 and channel 46 directly communicate. Housing 38 of connecting plate 18 is cylindrical and has a circular cross-section in a plane parallel to plane P. d38 denotes the internal diameter of housing 38.

Base 40 of the connecting plate 18 slides on manifold 12 of cooling circuit 4 along plane P.

First portion 42 of connecting plate 18 is designed to come into abutment against internal surface 224 of support member 22. Second portion 44 is designed to be in contact with shifting device 25, in particular, with spring 34.

Figure 3:
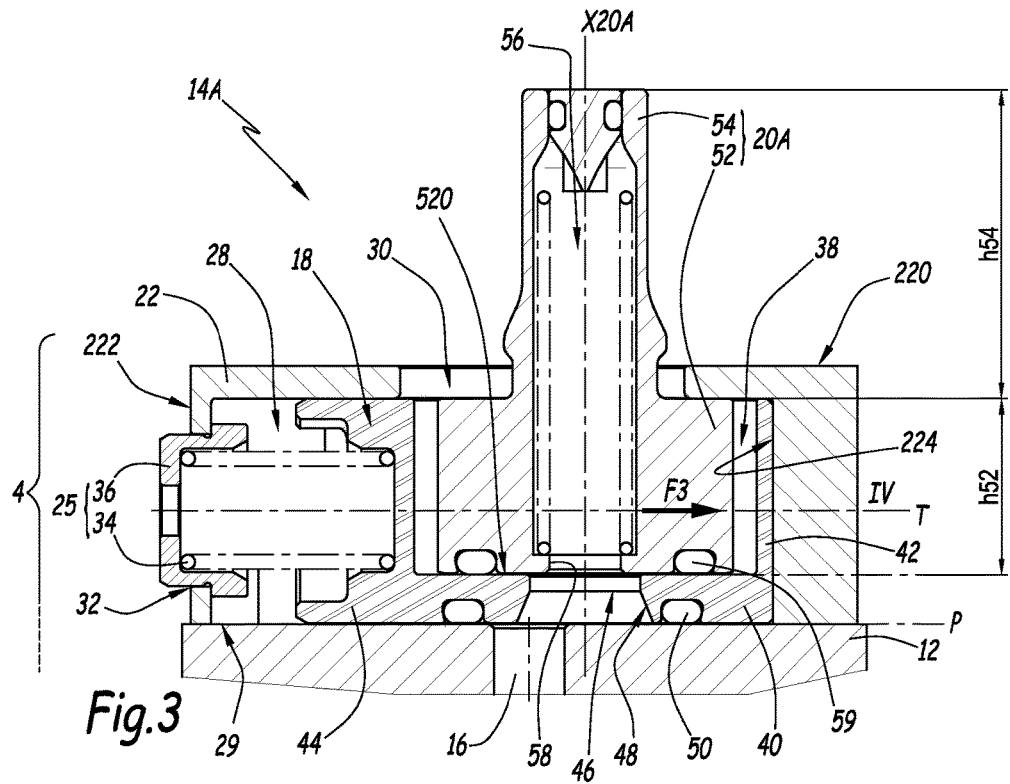
FIG. 3 is a sectional view, along cutting plane III of FIG. 2, of the connection plug.
Figure 4:
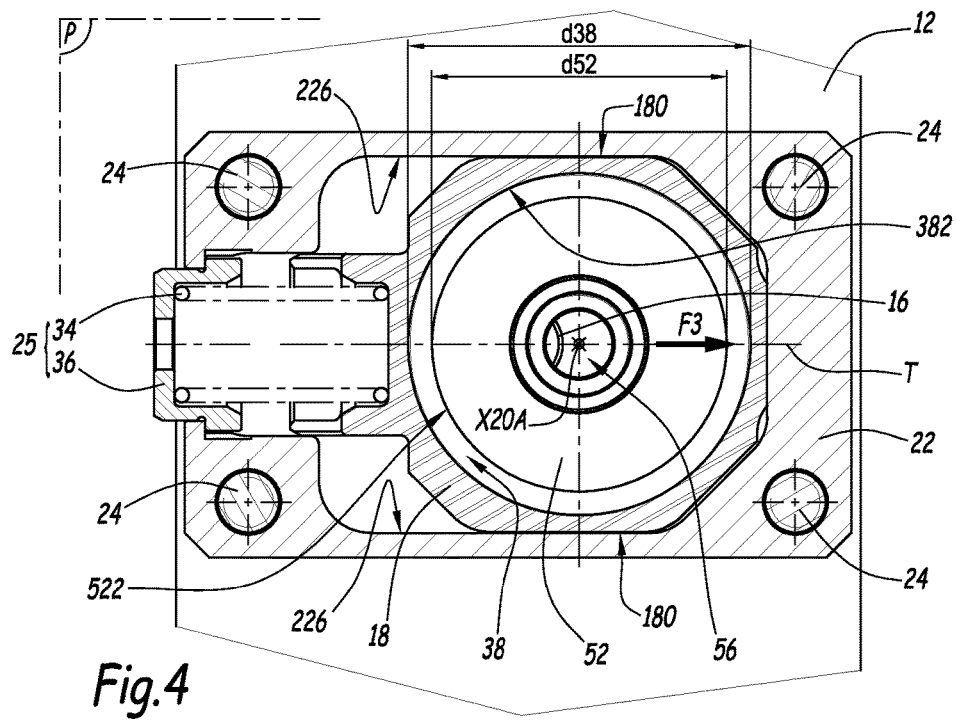
FIG. 4 is a sectional view, along cutting plane IV of FIG. 2, of the connection plug; plane IV is also shown on FIG. 3.

Thus, connecting plate 18 is capable of a movement M2, along principal transverse axis T, in a direction opposite to principal direction F3, and with respect to support member 22, for displacement of the fluidly coupled cold plate 2 relative to the support member 22 against the spring 34. In particular, connecting plate 18 is only movable in translation between a first position, shown on FIGS. 3 and 4, where spring 34 urges connecting plate 18 in abutment against internal surface 224, and a second position, shown on FIG. 7, where spring 34 is compressed by second portion 44 and connecting plate 18 is offset, along axis T, by a non zero distance, with respect to internal surface 224.

Figure 7:
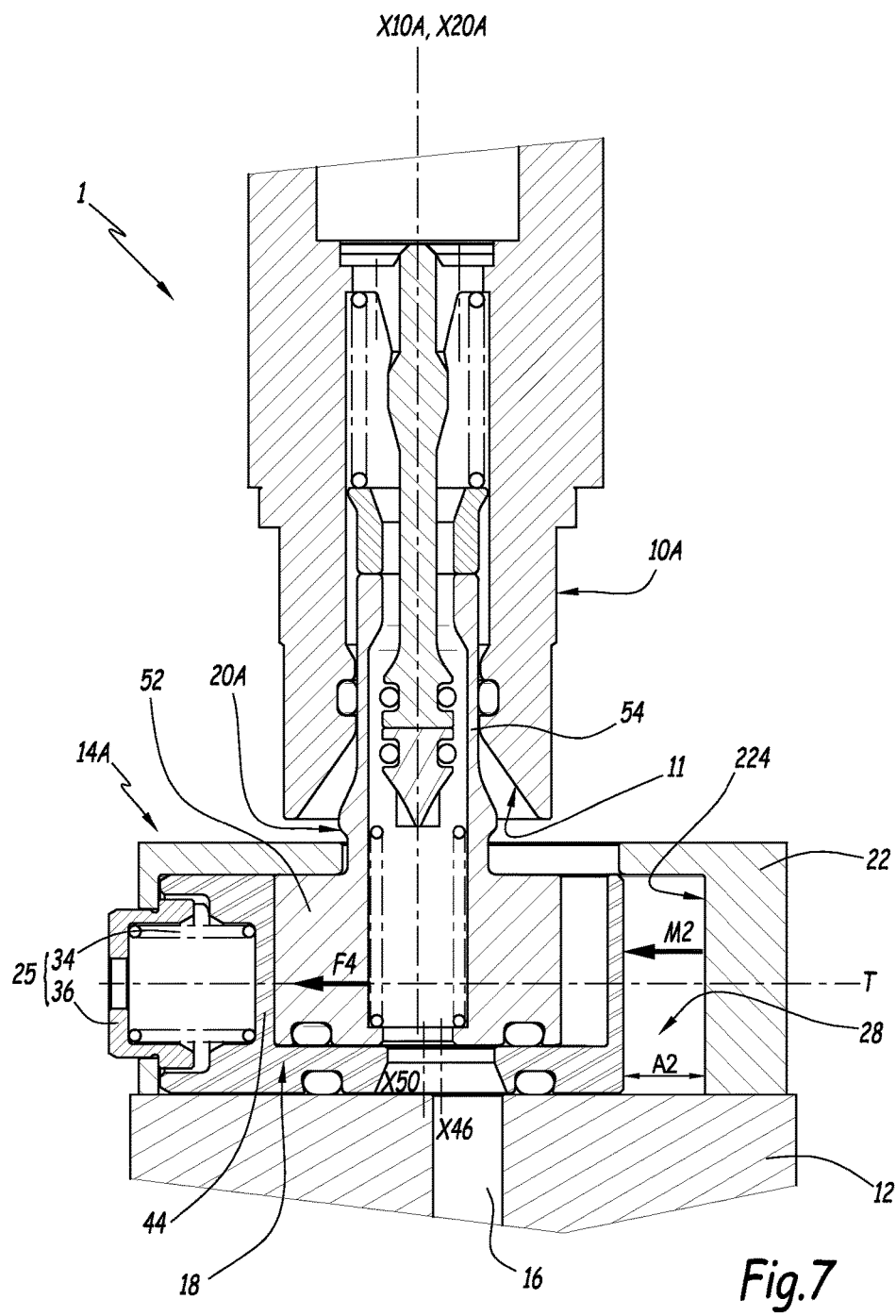
FIG. 7 is a sectional view similar to FIGS. 5 and 6, when the assembly is in a locked configuration.
Figure 8:
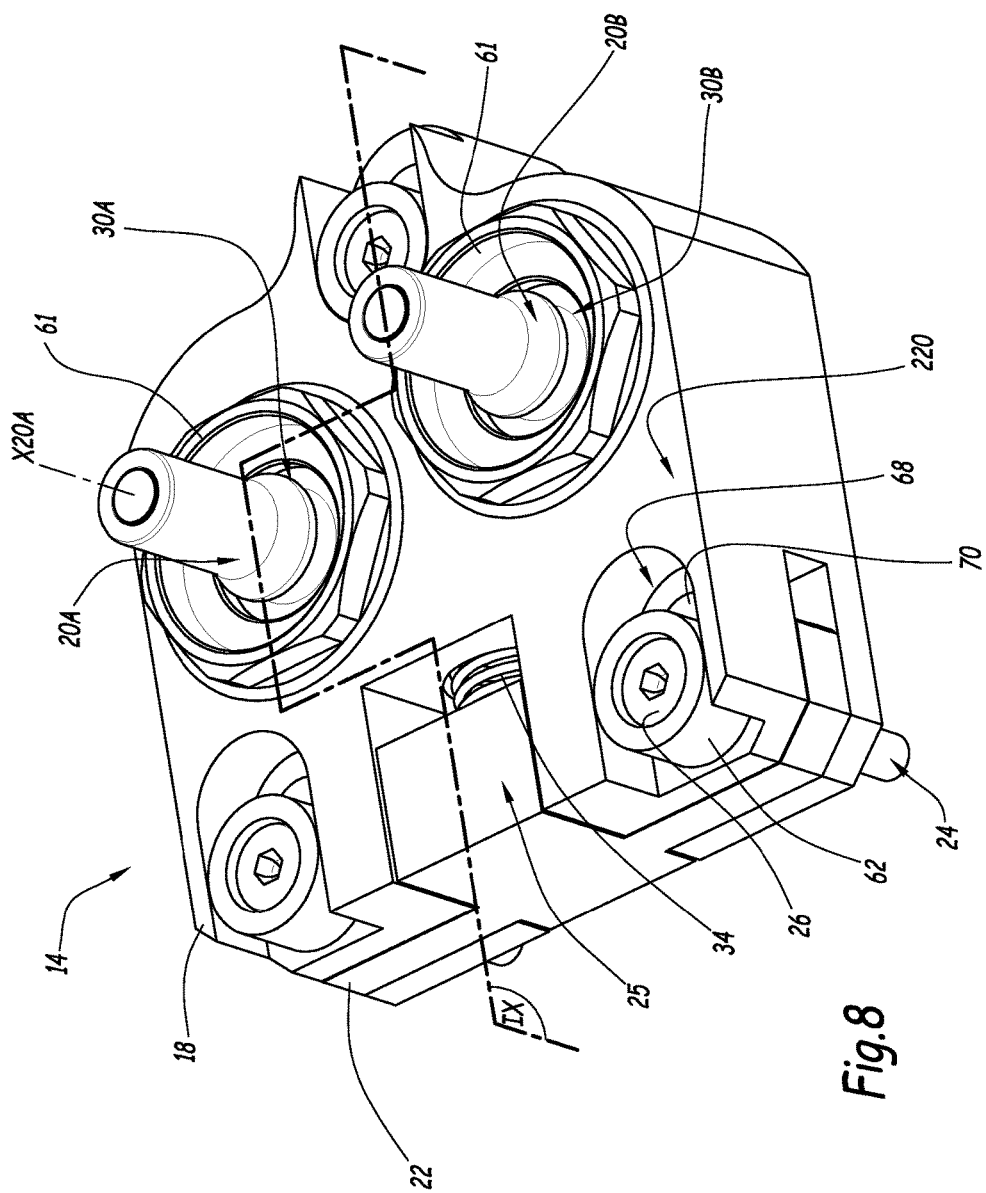
FIG. 8 is a perspective view of a connection plug according to a second embodiment of the invention.

Movement M2 has a maximal amplitude along principal axis T, which is shown on FIG. 7 with reference A2 and corresponds to the maximum possible distance between connecting plate 18 and internal surface 224 when connecting plate 18 is housed in housing 28 and is placed in its shifted position. A2 is between 3 and 5 mm, in the example it is equal to 4 mm.

Movement M2 occurs along contact surfaces between connecting plate 18 and support member 22. In particular, during movement M2, two lateral outer surfaces 180 of connecting plate 18, which are parallel to axis T direction, cooperate with two lateral inner surfaces 226 of support member 22, which are parallel to axis T direction. The cooperation between surfaces 180 and 226 guides movement M2 of connecting plate 18 along principal transverse axis T. Moreover, surface 182 of connecting plate 18 slides on manifold 12. Thus, surfaces 180, 182, 226 and the surface of manifold 12 which defines plane P constitute contact surfaces for guiding movement M2.

Movement M2 occurs when couplings elements 10A and 20A are already fluidly coupled, so that no additional guiding post is needed.

Fluid coupling element 20A is designed to be in fluid communication with passage channel 46 along fluid direction F1. Coupling element 20A includes a base 52 and a tip 54.

Base 52 of coupling element 20A is cylindrical and is located in housing 38 of connecting plate 18 and it is partially in contact with support member 22. Then, base 52 is sandwiched between support member 22 and connecting plate 18. Moreover, connecting plate 18 is sandwiched between support member 22 and manifold 12. This allows to control compression of circular seal 50.

Tip 54 of coupling element 20A is designed to cooperate with external coupling element 10A of cold plate 2. Thus, tip 54 of coupling element 20A protrudes along central axis X20A through front opening 30 of outer surface 220 of support member 22. Tip 54 is the only component of the connection plug 14A that projects from the support member 22 at the opposite of the manifold 12.

h52 denotes the height of base 52 along axis X20A, whereas h54 denotes the height of tip 54 along axis X20A. Height h52 is greater than or equal to a quarter of height h54. Base 52 and tip 54 of coupling element 20A each have a circular section in a plane parallel to plane P, as shown on FIG. 4. An outer diameter d52 of cylindrical base 52 of coupling element 20A is smaller than inner diameter d38 of cylindrical housing 38.

Fluid coupling element 20A includes a cavity 56 which extends along central axis X20A through base 52 and tip 54. Cavity 56 is opened in both directions along central axis X20A, so that coupling element 20A allows a fluid communication through cavity 56. Cavity 56 includes a shut-off valve 57 and has a opening 58 through base 52, which is opened towards passage channel 46 of connecting plate 18. Opening 58 is circular and has a diameter d58. Diameter d58 of opening 58 is smaller than diameter d46 of passage channel 46.

A circular seal 59 is located around opening 58 and housed in a groove provided on a face 520 of base 52. The base 52 slides on connecting plate 18. Thus, circular seal 59 is designed to provide tightness between coupling 20A and connecting plate 18 and ensure a leaktight fluid communication between passage channel 46 and cavity 56. Sandwiching base 52 between support member 22 and connecting plate 18 allows to control the compression of circular seal 59.

Fluid coupling element 20A is capable of a movement M1 with respect to passage channel 46 of connecting plate 18, for misalignment compensation of fluid coupling element 20A, i.e. for alignment of the fluid coupling element 20A with the external coupling element 10A. Thus, base 52 of fluid coupling element 20A is movable with respect to connecting plate 18 in a plane parallel to plane P, perpendicular to axis X46. Then, base 52 is movable with respect to connecting plate 18 in all directions perpendicular to axis X46, around a central position, which is shown on FIG. 4, where a lateral outer cylindrical surface 522 of base 52 is at equal distance from an internal cylindrical surface 382 of housing 38 in all perpendicular directions around axis X20A.

Figure 6:
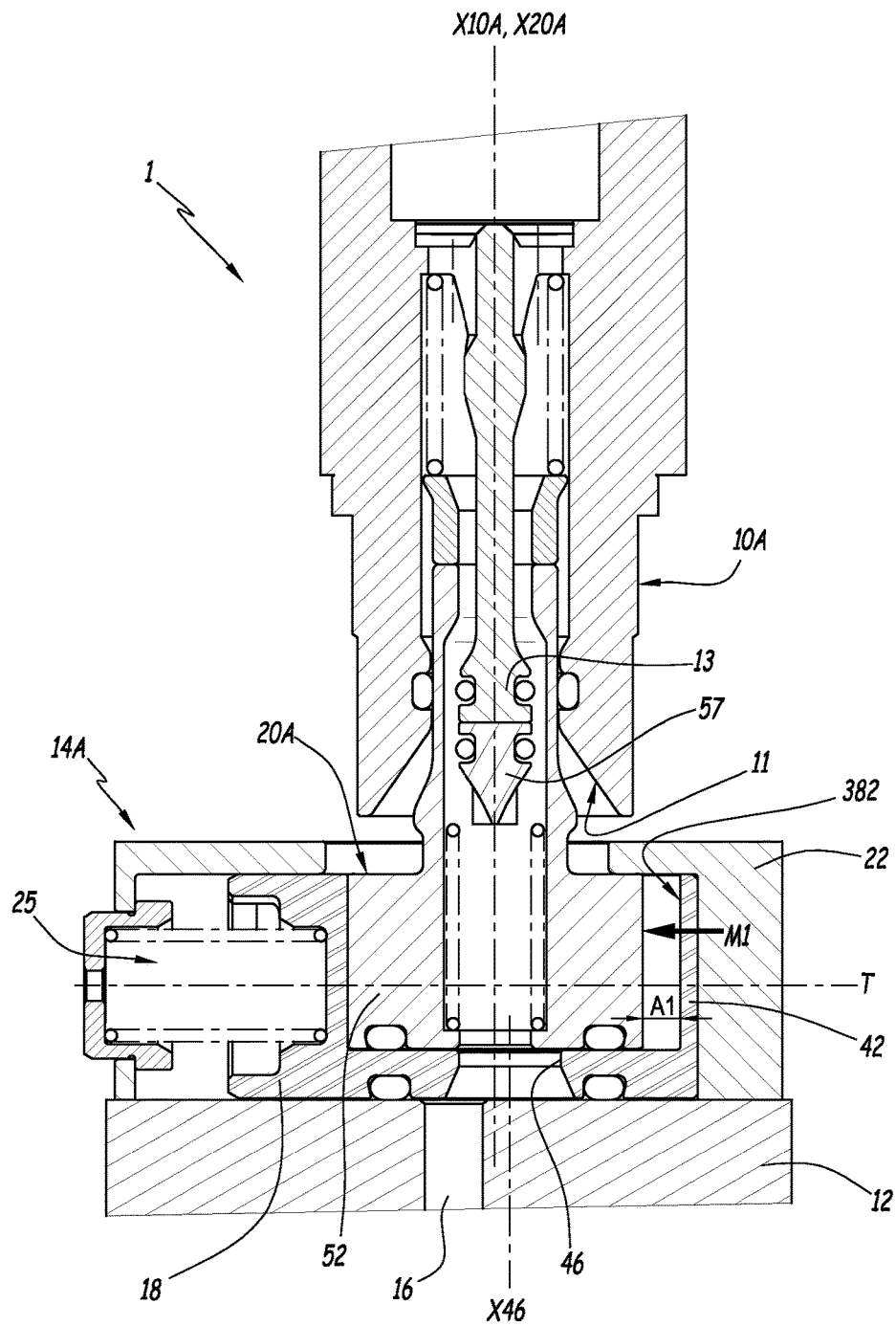
FIG. 6 is a sectional view similar to FIG. 5, when the assembly is in a coupled configuration.

Movement M1 has a maximal amplitude along principal transverse axis T which is shown in FIG. 6 with reference A1 and corresponds to the maximum radial distance between surfaces 522 and 382. A1 is equal to 2 mm. Maximal amplitude A2 is greater than maximal amplitude A1 of movement M1 of coupling element 20A. Therefore, the size of chamfer 11 is reduced as far as possible.

The shift d between axis X50 and axis X46 allows having the smallest diameter d50 that is compatible with maximal amplitudes A1 and A2 for limiting fluid forces during displacement of the connecting plate with movement M2.

Movement M1 occurs along contact surfaces between coupling element 20A and connecting plate 18 without counteracting some elastic forces. As coupling element 20A freely moves relative to connecting plate 18, no guiding post is needed. As no guiding post extends between connecting plate 18 and cold plate 2, fluid coupling element 20A may be moved by the cold plate 2 within connecting plate 18.

During movement M1, circular seal 59 stays in contact with connecting plate 18 around passage channel 46 so that a tight fluid communication between cavity 56 and passage channel 46 is ensured.

Diameter d50 of circular seal 50 is greater than the sum of maximal amplitudes A1 and A2.

X20B denotes the central axis of the coupling element of connection plug 14B.

Assembly 1, made of cold plate 2 and cooling circuit 4, is designed to be in a coupled configuration or in a uncoupled configuration.

Figure 5:
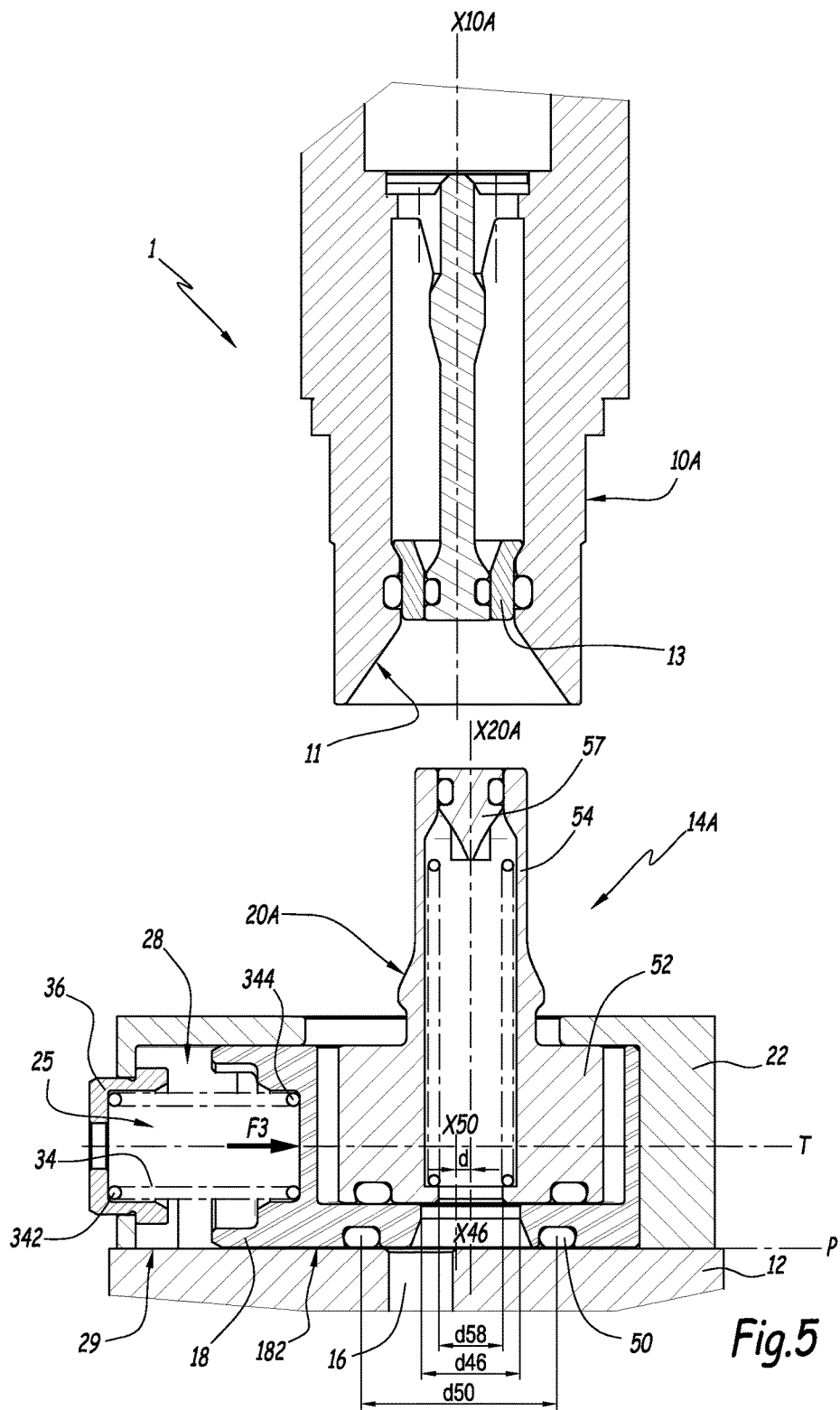
FIG. 5 is a partial sectional view, along cutting plane V of FIG. 1, of the assembly which is in a uncoupled configuration.

In the uncoupled configuration, the two external coupling elements 10A and 10B of cold plate 2 are not in fluid communication with the two fluid coupling elements 20A and 20B of connection plugs 14A and 14B. In this uncoupled configuration, as shown on FIG. 5, coupling elements 10A and 20A can be in misalignment. Respective axes X10A and X20A are parallel but not coinciding. In the uncoupled configuration, shifting device 25 is urging connected plate 18 in abutment against internal surface 224 of support member 22 and coupling element 20A is in a random position with respect to connecting plate 18, around the central axis X46.

As cold plate 2 is moved towards cooling circuit 4 along a coupling direction that is parallel to central axis X46, each external coupling elements 10A and 10B engages the corresponding fluid coupling element 20A and 20B. Since fluidic coupling elements 20A and 20B are in misalignment with respect to external coupling elements 10A and 10B, tips 54 of the two fluid coupling elements 20A and 20B come in contact against chamfers 11 of external coupling elements 10A and 10B. Chamfers 11 guide coupling elements 20A and 20B respectively into external coupling elements 10A and 10B. Thus, the coupling between elements 20A, 20B and 10A, 10B is a blind coupling. As shown on FIG. 6, each external coupling element 10A and 10B receives the corresponding fluid coupling element 20A and 20B. When the coupling elements 20A, 20B and 10A, 10B are respectively aligned and engaging, the shut-off valves 13 and 57 are pushed backwards, allowing fluid communication and fluid coupling. The movement of cold plate 2 towards cooling circuit 4 is limited by a stop which is not represented on figures. Assembly 1 is then in the coupled configuration.

As tips 54 of coupling elements 20A and 20B come in contact with chamfers 11, coupling elements 20A and 20B move within corresponding housing 38 of connecting plate 18, in order to align their respective central axes X20A and X20B respectively with central axes X10A and X10B of external coupling elements 10A and 10B. In other words, when assembly 1 is in the coupled configuration, the two fluid coupling elements 20A and 20B may be in a shifted position with respect to central axis X46 of corresponding passage channel 46 of connecting plate 18.

As assembly 1 is in the coupled configuration, cold plate 2 can be moved between a locked configuration and an unlocked configuration. In particular, assembly 1, shown in FIG. 6, is in the coupled configuration and cold plate 2 in the unlocked configuration, since the connecting plate 18 is not shifted along principal axis T against spring 34 with respect to support member 22. In the unlocked configuration, when connecting plate 18 is in its non-shifted position, chamfer 48 partially overlaps internal channel 16.

In order to reach the locked configuration, cold plate 2 is moved, along principal axis T, in a direction F4 which is opposite to direction F3. Coupling elements 20A and 20B follow movement of the cold plate 2 and slide within the housings 38 until each coupling element 20A, 20B abuts with its connecting plate 18. Contact between cylindrical base 52 and cylindrical housing 38 of the connecting plate 18 is a linear contact. As soon as coupling element 20A or 20B abuts, the transversal movement of cold plate 2 is transmitted to respective connecting plate 18. Transversal movement M2 is against the elastic effort of spring 34, so that spring 34 is compressed by second portion 44 of connecting plate 18, as shown in FIG. 7. During movement M2 of connecting plate 18, circular seal 50 stays in contact with manifold 12 around the internal channel 16 for a tight fluid communication between internal channel 16 and passage channel 46. When connecting plate 18 is shifted along axis T from internal surface 224 of support member 22 with maximal amplitude A2, chamfer 48 of passage channel 46 completely overlaps channel 16 of manifold 12, so that a more efficient fluid communication is established between cooling circuit 4 and cold plate 2 in the locked configuration of the cold plate 2 than in its unlocked configuration. Non represented locking means, such as a latch are used to hold cold plate 2 in the locked configuration. In another variant, the locked configuration corresponds to a connected configuration in which the cold plate 2 is held.

A method for connecting cooling circuit 4 and cold plate 2 comprises a first step a) of aligning fluid coupling elements 20A and 20B with respect to external coupling elements 10A and 10B. The method comprises a second step b) of fluidly coupling fluid coupling elements 20A and 20B with external coupling elements 10A and 10B, cold plate 2 being in the coupled configuration. Finally, the method comprises the step c) of moving cold plate 2 relative to support member 22 along principal axis T towards the locked configuration. In particular, during step c), cold plate 2 moves relative to connecting plate 18 of cooling circuit 4 along principal transverse axis T.

As the assembly 1 is in the locked configuration, cold plate 2 can reach again the unlocked configuration and the uncoupled configuration. In order to reach the unlocked configuration, locking means are "switched off" and cold plate 2 is moved along principal axis T in direction F3 which is opposite to direction F4. In other words, cold plate 2 is moved in the direction of action of spring 34. Thus, spring 34, elastically keeps the connecting plate 18 in abutment against support member 22. Assembly 1 in the unlocked configuration and still in the coupled configuration.

In order to reach the uncoupled configuration, cold plate 2 is moved along axis X20A and in direction F1, so as to disconnect external coupling elements 10A and 10B from coupling elements 20A and 20B. Then shut-off valves 13 and 57 are pushed back and the fluid communication is interrupted. Assembly 1 is then in the uncoupled configuration.

FIGS. 8 to 11, show a second embodiment of the invention. The components of assembly 1 according to this second embodiment, which are the same as those of the first embodiment, bear the same references and they are not described in detail, as the description here-above can be transposed.

Figure 9:
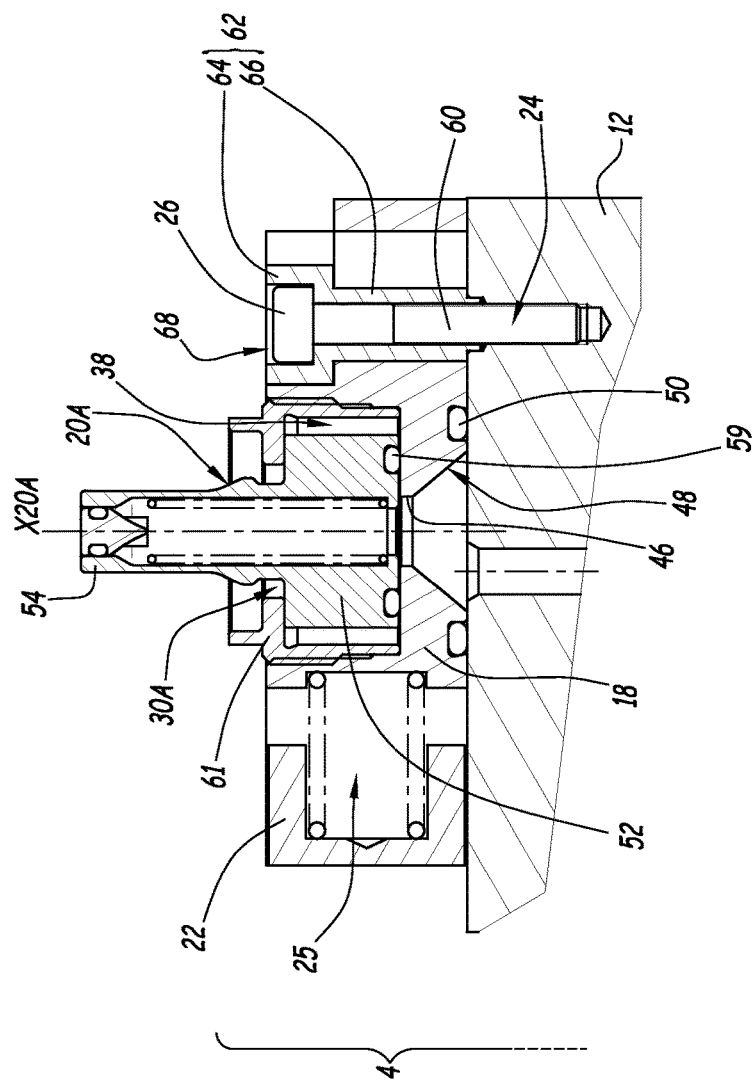
FIG. 9 is a sectional view, along cutting plane IX of FIG. 8, of the connection plug.

Cooling circuit 4 includes only one connection plug 14. Connection plug 14 includes both fluid coupling elements 20A and 20B. Connecting plate 18 of connection plug 14 is equipped with two passage channels 46, each one including a chamfer 48, as described here-above. Each fluid coupling elements 20A and 20B is designed to be in fluid communication with the corresponding passage channel 46. As shown in FIG. 9, connecting plate 18 of connection plug 14 also includes two cylindrical housings 38 delimited by two screwed covers 61 of connecting plate 18 and by base 40 of connecting plate 18. One corresponding fluid coupling element 20A or 20B is accommodated in each housing 38.

Each cylindrical base 52 is sandwiched between corresponding cover 61 and base 40 of connecting plate 18 so as to control compression of circular seal 59. Each cover 61 includes two front openings 30A and 30B, in which coupling elements 20A and 20B are partially inserted. In particular, tips 54 of coupling elements 20A and 20B are respectively inserted in openings 30A and 30B.

Connection plug 14 includes three fastening screws 24 which are designed to fix support member 22 to manifold 12 of cooling circuit 4. Fastening screws 24 are distributed in a triangle around coupling elements 20A and 20B, which is advantageous in terms of compactness. One of fastening screws 24 is positioned between two coupling elements 20A and 20B. Each fastening screw 24 includes a head 26 and a stem 60. Each fastening screw 24 is housed in a spacer sleeve 62. Spacer sleeve 62 includes a head portion 64 and a stem portion 66. In particular, head portion 64 is designed to receive head 26 of fastening screw 24, whereas stem portion 66 is designed to receive stem 60 of fastening screw 24. Moreover, stem portion 66 is housed in a receiving bore of support member 22 without possibility of transversal movement, whereas head portion 64 and stem portion 66 of spacer sleeve 62 are received respectively in an oblong recess 68 of the connecting plate 18 and in an oblong hole 70 of the connecting plate 18. In this way, heads 26 of fastening screws 24 are embedded with respect to outer surface 220 of support member 22 and oblong hole 70 of the connecting plate 18 guides the connecting plate 18 relative to the support member 22 between unlocked and locked configurations. Thus, each fastening screw 24 sandwiches spacer sleeve 62 between head 26 and manifold 12 whereas each spacer sleeve 62 sandwiches connecting plate 18 between head portion 64 and manifold 12, since, as shown on FIG. 9, stem portion 66 of spacer sleeve 62 is in direct contact with manifold 12. Then, fastening screws 24 and spacer sleeves 62 guarantee a sealing compression between connecting plate 18 and manifold 12.

Fluid coupling elements 20A and 20B are capable of movement M1 with respect to correspondent passage channel 46 of connecting plate 18 for misalignment compensation of fluid coupling element 20A or 20B along transversal directions. Even if connection plug 14 includes both fluid coupling elements 20A and 20B, thanks to the separate housings 38 of connecting plate 18, movements M1 of coupling elements 20A and 20B are independent from each other.

Connecting plate 18 is capable of movement M2 with respect to support member 22 for moving the fluidly coupled cold plate 2 between unlocked and locked configurations.

In both unlocked and locked configurations and between these configurations, chamfer 48 of passage channel 46 totally overlaps internal channel 16 of the manifold and circular seal 50 surrounds channel 16 for a tight fluid communication.

Connecting plate 18 is in contact with spring 34 of shifting device 25. Here, a single shifting device 25 is designed to elastically push connecting plate 18 with respect to support member 22 along principal transverse axis T. As assembly 1 is in the uncoupled configuration, external coupling elements 10A and 10B of cold plate 2 are not in fluid communication with fluid coupling elements 20A and 20B of connection plug 14. Thus, external coupling element 10A and 10B can be in misalignment with respect to coupling elements 20A and 20B.

Figure 10:
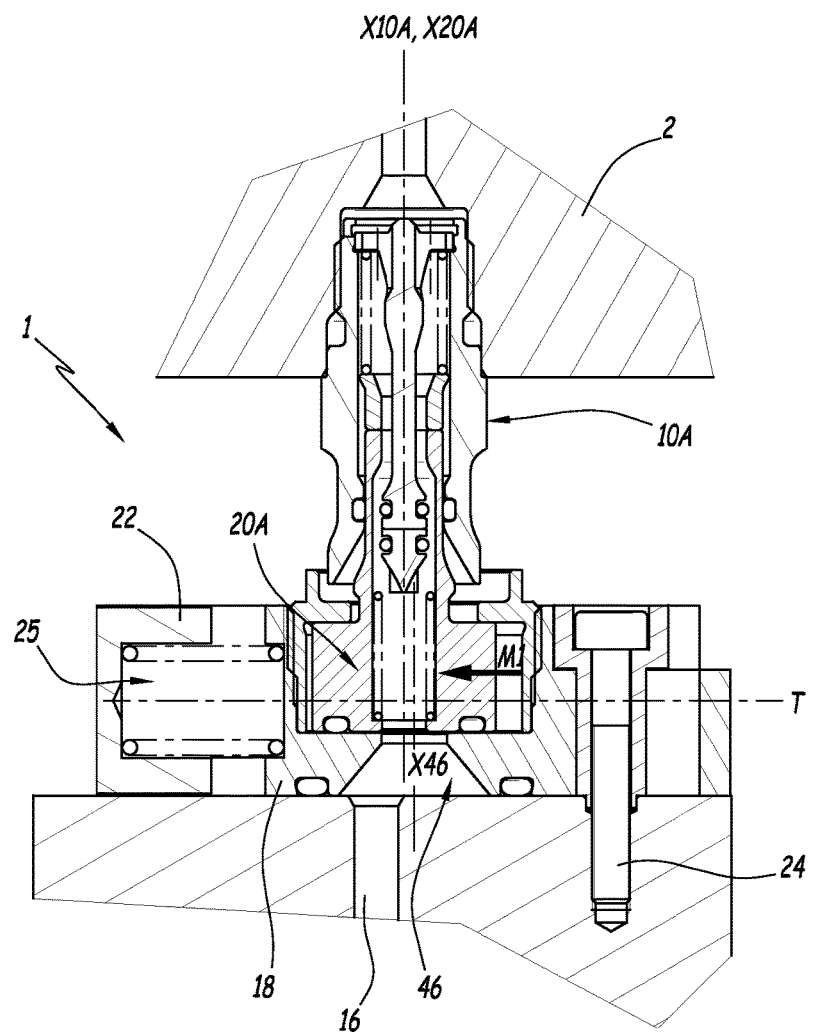
FIG. 10 is a sectional view similar to FIG. 9, when an assembly, according to a second embodiment of the invention which incorporates the connection plug of FIGS. 8 and 9, is in a coupled configuration.

As assembly 1 is in the coupled configuration, each external coupling element 10A and 10B receives corresponding fluid coupling elements 20A and 20B. As shown in FIG. 10 for external coupling element 10A only, the two fluid coupling elements 20A and 20B of connection plug 14 are then shifted with respect to central axis X46 on connecting plate 18, depending on the misalignment between 10A and 20A, respectively 10B and 20B, at the beginning of the coupling.

Figure 11:
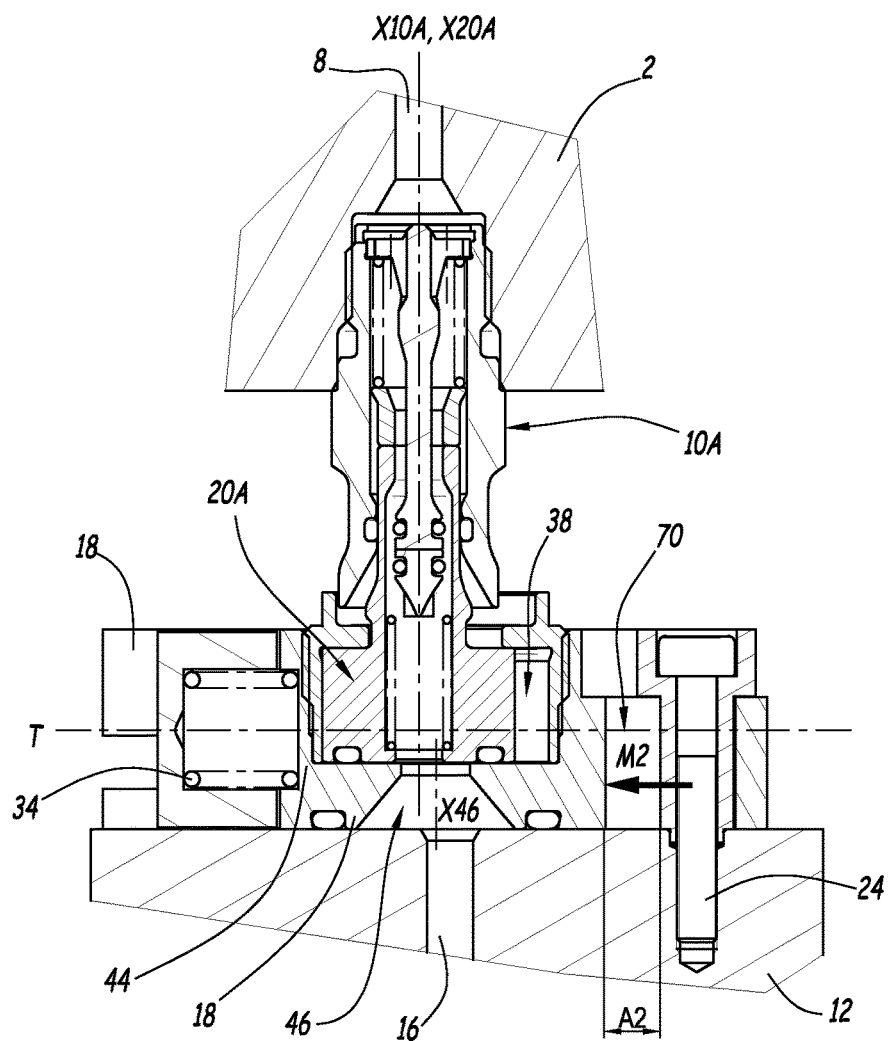
FIG. 11 is a cutting view similar to FIG. 10, when the assembly according to the second embodiment is in a locked configuration.

As assembly 1 is in the coupled configuration, in order to reach to the locked configuration, cold plate 2 is moved along principal axis T. First, one of two coupling elements 20A or 20B is brought into abutment against connecting plate 18 if it was not already done by previous alignment between the coupling elements, and then movement of cold plate 2 towards its locked configuration moves connecting plate 18 against the elastic effort of spring 34, as shown in FIG. 11. Thus, portion 44 of connecting plate 18 compresses spring 34 and connecting plate 18 is shifted along principal axis T. This movement corresponds to movement M2.

Position of connecting plate 18 with respect to support member 22 in locked configuration of cold plate 2 depends on the position of coupling elements 10A, 20A relative to central axis X46 before moving cold plate 2 in direction F4.

The two embodiments have been described with coupling elements 20A, 20B that are only able to adjust their position along perpendicular directions with respect to correspondent central axis X46 of passage channel 46 of connecting plate 18 ("lateral movement" couplings) for misalignment compensation of fluid coupling element 20A or 20B. Some other coupling elements, as oscillating coupling elements, may be used instead of the displacement coupling elements to align themselves with coupling elements 10A and 10B. The oscillating coupling elements are movable within connecting plate 18 and can tightly incline themselves regarding to passage channel 46. The embodiments and alternative embodiments mentioned here-above can be combined in order to generate new embodiments of the invention.

The invention claimed is:

1. A connection plug, this connection plug including:
    a connecting plate equipped with at least a passage channel centered on a central axis,
    at least one fluid coupling element able to be fluidly coupled with an external fluid coupling element of a cold plate,
the fluid coupling element being movable, in a housing of the connecting plate, with respect to the passage channel of the connecting plate for misalignment compensation of the fluid coupling element while being in fluid communication with the passage channel, wherein:
    the connection plug includes a support member able to be fixed with respect to an internal channel for a fluid communication between the internal channel and the passage channel,
    the connection plug also includes a spring designed to elastically push the connecting plate with respect to the support member along a principal axis transverse to the central axis of the passage channel, and an abutment surface having a fixed position relative to the support member along the principal axis,
    the connecting plate is movable with respect to the support member along the principal axis between a first position and a second position, wherein in the first position, the connecting plate is pushed by the spring in abutment against the abutment surface, and wherein in the second position, the connecting plate is shifted from the abutment surface,
    and wherein the movement between the fluid coupling element and the connecting plate has a first maximal amplitude along the principal traverse axis, the movement between the connecting plate and the support member has a second maximal amplitude along the principal transverse axis, the second maximal amplitude being greater than the first maximal amplitude.

2. The connection plug according to claim 1, wherein the fluid coupling element includes a base, able to move in a plane perpendicular to the central axis relative to the connecting plate, and a tip, designed to cooperate with an external coupling element of the cold plate.

3. The connection plug according to claim 2, wherein the base of the fluid coupling element is housed in the housing of the connecting plate and in that the housing of the connecting plate and the base of the fluid coupling element are cylindrical.

4. The connection plug according to claim 2, wherein the support member defines a housing designed to house the connecting plate and in that the base is sandwiched between the support member and the connecting plate.

5. The connection plug according to claim 1, wherein a circular seal is located in the connecting plate around the passage channel, the circular seal defines a central axis and the central axis of the circular seal is shifted with respect to the central axis of the passage channel.

6. The connection plug according to claim 1, wherein the support member has two lateral surfaces able to cooperate with two lateral surfaces of the connecting plate for guiding the movement of the connecting plate along the principal transverse axis.

7. The connection plug according to claim 1, wherein a cap is mounted on a lateral opening of the support member, the spring being in contact with the cap at a first end and in contact with the connecting plate at a second end, the first end of the spring being located outside the support member.

8. The connection plug according to claim 1, wherein:
    the connecting plate is equipped with two passage channels,
    the connection plug includes two fluid coupling elements, each one designed to be in fluid communication with the corresponding passage channel,
    each fluid coupling elements is able to move with respect to the corresponding passage channel, and
    the connecting plate is movable along the principal transverse axis.

9. A cooling circuit for a cold plate including:
    a manifold equipped with the at least one internal channel,
    at least one connection plug according to claim 1,
    each support member being fixed to the manifold.

10. The cooling circuit according to claim 9, wherein the connecting plate is sandwiched between the support member and the manifold.

11. The cooling circuit according to claim 10, wherein, when the connecting plate is shifted along principal axis against the spring with a maximal amplitude, the passage channel of the connecting plate entirely overlaps the corresponding internal channel of the manifold.

12. A method for connecting a cooling circuit according to claim 9 and a cold plate provided with a cooling channel and two external coupling elements, the method comprising at least the successive steps of:
- a) aligning the fluid coupling elements with respect to the external coupling elements by moving the fluid coupling elements relative to the corresponding passage channel of the connecting plate,
- b) fluidly coupling the fluid coupling elements with the external coupling elements,
- c) moving the cold plate relative to the support member along the principal transverse axis.

13. The method according to claim 12, wherein, during step c), the cold plate moves relative to at least one of the connecting plate of the cooling circuit along the principal transverse axis.

14. A cooling circuit for a cold plate including:
   a manifold equipped with the at least one internal channel,
   at least one connection plug according to claim 8,
   each support member being fixed to the manifold.

15. The cooling circuit according to claim 14, wherein the connecting plate is sandwiched between the support member and the manifold.

16. The cooling circuit according to claim 15, wherein, when the connecting plate is shifted along principal axis against the spring with a maximal amplitude, the passage channel of the connecting plate entirely overlaps the corresponding internal channel of the manifold.

17. A method for connecting a cooling circuit according to claim 14 and a cold plate provided with a cooling channel and two external coupling elements, the method comprising at least the successive steps of:
- d) aligning the fluid coupling elements with respect to the external coupling elements by moving the fluid coupling elements relative to the corresponding passage channel of the connecting plate,
- e) fluidly coupling the fluid coupling elements with the external coupling elements,
- f) moving the cold plate relative to the support member along the principal transverse axis.

18. The method according to claim 17, wherein, during step c), the cold plate moves relative to at least one of the connecting plate of the cooling circuit along the principal transverse axis.

* * * * *